(12) United States Patent
Mittal

(10) Patent No.: US 11,816,409 B1
(45) Date of Patent: Nov. 14, 2023

(54) STRONGLY CONNECTED COMPONENT (SCC) GRAPH REPRESENTATION FOR INTERACTIVE ANALYSIS OF OVERLAPPING LOOPS IN EMULATION AND PROTOTYPING

(71) Applicant: Synopsys, Inc., Mountain View, CA (US)

(72) Inventor: Ribhu Mittal, Portland, OR (US)

(73) Assignee: Synopsys, Inc., Sunnyvale, CA (US)

( * ) Notice: Subject to any disclaimer, the term of this patent is extended or adjusted under 35 U.S.C. 154(b) by 103 days.

(21) Appl. No.: 17/498,658

(22) Filed: Oct. 11, 2021

Related U.S. Application Data

(60) Provisional application No. 63/092,372, filed on Oct. 15, 2020.

(51) Int. Cl.
*G06F 30/327* (2020.01)
*G06F 30/31* (2020.01)

(52) U.S. Cl.
CPC ............ *G06F 30/327* (2020.01); *G06F 30/31* (2020.01)

(58) Field of Classification Search
CPC .................................................... G06F 30/327
USPC ......................................................... 716/106
See application file for complete search history.

(56) References Cited

U.S. PATENT DOCUMENTS 9,836,568 B1 * 12/2017 Ganusov ................. G06F 30/34
2016/0224710 A1 * 8/2016 Dua ....................... G06F 30/398

* cited by examiner

*Primary Examiner* — Eric D Lee
(74) *Attorney, Agent, or Firm* — Fenwick & West LLP

(57) ABSTRACT

Embodiments relate to a system and method for analyzing strongly connected components (SCCs) in a design of an integrated circuit. In one embodiment, a design of an integrated circuit is received, and a set of loops are identified in the received design. Based on the identified loops, one or more SCCs are determined. Each SCC includes multiple loops having shared paths. For instance, an SCC includes a first loop having a first set of nodes connected via a first set of paths and a second loop having a second set of nodes connected via a second set of paths, such that the first loop and the second loop have at least one path in common. The identified SCCs are then analyzed and presented to the user for consideration when reviewing the design of the integrated circuit.

20 Claims, 9 Drawing Sheets

STRONGLY CONNECTED COMPONENT (SCC) GRAPH REPRESENTATION FOR INTERACTIVE ANALYSIS OF OVERLAPPING LOOPS IN EMULATION AND PROTOTYPING

RELATED APPLICATION

This application claims a benefit of U.S. Patent Application Ser. No. 63/092,372, filed Oct. 15, 2020, the contents of which is incorporated by reference herein.

TECHNICAL FIELD

The present disclosure is generally related to an electronic design and automation system, and more specifically to a system and method for providing a strongly connected component (SCC) graph representation for interactive analysis of overlapping loops in emulation and prototyping.

BACKGROUND

In electronic circuit design, a circuit loop can be of different types, including a combinatorial loop and a sequential loop. Sequential loops create feedback path between output and clock/control input of a flip-flop, and/or input and output of a latch when the latch is transparent, i.e., when output of the latch follows the value of the input of the latch. Loops are generally undesirable in a circuit design and may cause many issues during execution. For example, due to an oscillatory nature of the loops, a same circuit design may behave non-deterministically from run to run. Many compiler tasks such as timing closure and path traversal may also become unreliable in the presence of loops. Accordingly, a user may write register transfer level (RTL) in such a way that loops are not present. However, even if a user designs an integrated circuit in a manner that loops are not present, the circuit design may still include loops when the circuit design is compiled and simulated using an emulation system. This may happen because of changes done to the original circuit design due to various reasons. For example, an emulation system may not support analog logic and a user may replace the analog logic with a behavioral model, which may not be written according to synthesizability rules and might contain loops. Moreover, the main purpose of the emulation system is to support verification. To achieve this objective, an emulation compiler may allow users to use many RTL constructs that are written for verification purpose and are not considered during the silicon design process. During synthesis of such verification RTL constructs, a new loop may be introduced in the gate level representation of the design.

SUMMARY

Embodiments relate to a method for analyzing strongly connected components (SCCs) in a design of an integrated circuit. A design of an integrated circuit is received, and a set of loops are identified in the received design. Based on the identified loops, one or more SCCs are identified. Based on the design characteristics, a SCC may include multiple loops having shared paths. For instance, an SCC includes a first loop having a first set of nodes connected via a first set of paths and a second loop having a second set of nodes connected via a second set of paths, such that the first loop and the second loop have at least one path in common. The identified SCCs are then analyzed and presented to the user for consideration when reviewing the design of the integrated circuit.

In some embodiments, an SCC includes a first loop having a first set of nodes connected via a first set of paths, and a second loop having a second set of nodes connected via a second set of paths. The first loop and the second loop have at least one node/path in common.

In some embodiments, the set of loops are identified by performing a connectivity analysis on a netlist of the design of the integrated circuit. In some embodiments, the design of the integrated circuit is register transfer level (RTL) design. Moreover, based on the RTL design, the netlist of the design of the integrated circuit is generated.

In some embodiments, a set of shared paths across all loops in an SCC are identified. Moreover, for each shared path in the SCC, a commonality score is determined. In some embodiments, based on the determined commonality scores, the one or more shared paths are ranks or sorted. Moreover, in some embodiments, based on the determined commonality scores, one or more paths to cut are identified. In some embodiments, the commonality scores are determined based at least on one of a number of loops that include the shared path, and a length of each loop that includes the shared path.

In some embodiments, the one or more strongly connected components are represented using a directional, asymmetrical polygon, wherein each vertex of the polygon corresponds to a node of the strongly connected components, and each line segment of the polygon represents a path connecting two nodes of the strongly connected components.

In some embodiments, a subset of loops of a strongly connected component is analyzed until a stop condition is met. For example, the stop condition may be a set number of loops analyzed. In another example, the stop condition is a set amount of time lapsed since the start of the analysis of the subset of loops of the strongly connected component.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to analyzing circuit designs to identify strongly connected components (SCC) within the circuit design. Moreover, the present disclosure provides an interface for allowing an interactive analysis on a graph representation of SCCs and loops, to aid users in finding and fixing the loops in a device under test (DUT).

A circuit design system (such as the computer system 900 of FIG. 9, or the host system 807 of FIG. 8) may use a SCC concept to visualize and analyze loops. A directed graph is a graph that is strongly connected if every vertex is reachable from every other vertex. A circuit design may contain many loops. If two or more loops have any overlap among them, the two loops may become part of the same SCC. An SCC may contain just one loop if these loops are completely isolated; or multiple loops, in case of an overlap. A circuit design system may generate a correlation between an SCC and corresponding loops. Moreover, the circuit design system may be able to break SCCs and provide deterministic results of the design. In some cases, these SCCs may be very complex or large and automatic breaking methods may not be able to break such SCCs in an RTL design.

SCC analysis may be part of a design validation where a user tries to ensure that any RTL, which may be used in the final chip, does not have potential loops. Loops present in other behavioral RTL, are also analyzed and broken through RTL recoding if a design validation tool is unable to do so automatically.

Advantages of the present disclosure include, but are not limited to, analyzing designs of integrated circuits to identify and remove loops within the design. Additionally, the present disclosure provides a mechanism for graphically representing loops within an integrated circuit design, and to provide a loop report to circuit designers to aid the circuit designers in identifying cut points in one or more loops of the circuit design, while maintaining the proper functionality of the circuit design.

Figure 1:
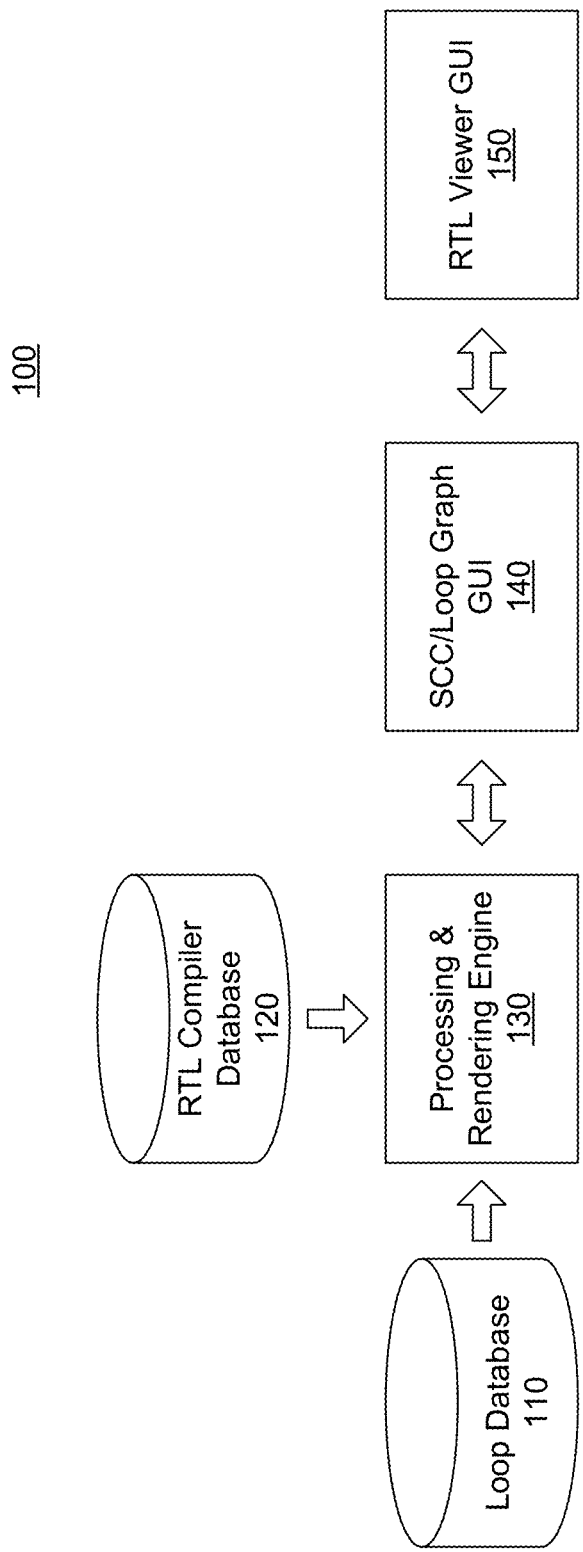
FIG. 1 illustrates a high-level block diagram of a SCC graph processing system for analysis of overlapping loops, according to one or more embodiments.

FIG. 1 illustrates a high-level block diagram of a SCC graph processing system for analysis of overlapping loops, according to one or more embodiments. The SCC graph processing system 100 includes a loop database 110, an RTL compiler database 120, a processing & rendering engine 130, an SCC/loop graph graphical user interface (GUI) 140, and an RTL viewer GUI 150. Each of the modules of the SCC graph processing system 100 may be implemented using the computer system 900 of FIG. 9, or the host system 807 of FIG. 8. In some embodiments, each of the modules are implemented using a different computing system. In other embodiments, two or more modules of the SCC graph processing system 100 are implemented using the same computing system.

A SCC graph processing system 100 stores a loop database 110 and an RTL compiler database 120. In some embodiments, information for generating or populating the loop database 110 is received from an emulation compiler. The loop database 110 stores information about SCCs in the circuit design and a number of loops in each SCC. In some embodiments, information for generating or populating the RTL compiler database 120 is also received from the emulation compiler and stores information about the circuit design (e.g., source code, disk location for the circuit design, etc.).

Processing & rendering engine 130 receives the loop database 110 and the RTL compiler database 120 as input. In some embodiments, the processing & rendering engine 130 receives information associated with one or more loops in the circuit design from the loop database 110, and information associated with the circuit design from the RTL compiler database 120. In some embodiments, the processing & rendering engine 130 generates SCC and loop information in a machine-readable format (e.g., structured query language (SQL)). Moreover, in some embodiments, the processing & rendering engine 130 processes the SCC and loop information and prepares the SCC and loop information for visualization. The SCC and loop information may be provided to the user in a SCC/loop GUI 140 as visualization, which may be linked with a RTL viewer GUI 150. SCC/loop graph GUI 140 may graphically display one or more SCCs and one or more loops discovered by the processing & rendering engine 130. The SCC/loop graph GUI 140 may additionally allow users to select a node of an SCC and allows the user to view the RTL implementation of the node (e.g., by opening the RTL viewer GUI to display the RTL implementation of the node).

Figure 2:
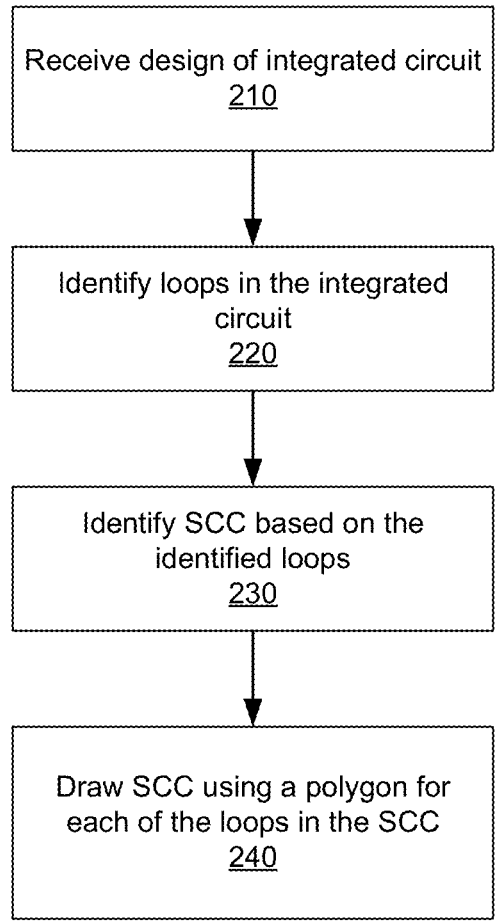
FIG. 2 illustrates a flow diagram of a process for graphically representing loops within a design of an integrated circuit, according to one or more embodiments.

SCCs in a circuit design are graphically represented using closed polygons to show the inter-relationships between an SCC and overlapping loops. FIG. 2 illustrates a flow diagram of a process for graphically representing loops within a design of an integrated circuit, according to one or more embodiments.

The SCC graph processing system 100 receives a design of an integrated circuit, at 210. In some embodiments, the design of the integrated circuit is received as one or more RTL designs. An RTL design may describe the flow of signals (e.g., digital signals) between hardware registers and logical operations performed on the signals. In some embodiments, based on the RTL designs, a netlist is generated. A netlist may describe the connectivity between electronics components in a circuit implementing the RTL design.

Based on the received design of the integrated circuit, loops within the integrated circuit design are identified, at 220. In some embodiments, each identified loop is stored in the loop database 110. In some embodiments, the loops are identified by performing a connectivity analysis on the netlist generated based on the RTL designs. In some embodiments, to identify loops in the design, the SCC graph processing system 100 identifies a signal path that starts at a given node of the design and returns to the given node. By performing the connectivity analysis using the netlist generated based on the RTL design, the connectivity analysis can account for multiple signals that have different RTL names but map to the same node. For example, an RTL design implementation may include two or more signals names that refer to the same signal. In this example, a connectivity analysis performed at the RTL level may treat each of the signal names as corresponding to a different node in the circuit. That is, the connectivity analysis performed at the RTL level may not capture that the two or more signal names refer to the same node and thus, may not be able to identify loops involving those signals names. However, the netlist generated based on the RTL design assigns the two or more signal names corresponding to the same signal to the same net, allowing the netlist level connectivity analysis to detect loops that an RTL level connectivity analysis might have missed.

Based on the identified loops, one or more SCCs are identified, at 230. In some embodiments, to identify an SCC, the SCC graph processing system 100 identifies loops that share one or more paths. For example, for a given loop, the SCC graph processing system 100 may identify all the paths within the given loop and determine whether one or more other loops includes one or more of the identified paths within the given loop.

The SCC graph processing system 100 draws the identified SCC using a polygon for each loop in the SCC, at 240. The polygon may be asymmetric to allow flexibility inside the processing & rendering engine 130 for visual representation. In some embodiments, the processing & rendering engine 130 selects a polygon to represent a loop within the SCC based on the number of nodes of the loop, and determines an angle for each of the vertices of the polygon based on characteristics of other loops that share a path with the loop. In some embodiments, the direction of the signal path is represented by the direction of the edges of the polygon used for representing a loop. For example, a loop may be drawn such that the signal path traverses the loop in the clockwise direction. Alternatively, other graphical representations may also be possible, for example, using arrows.

Figure 3A:
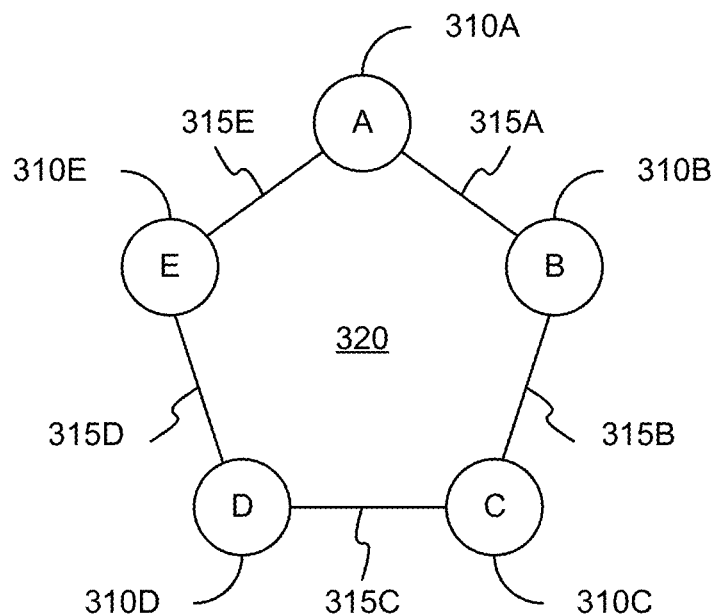
FIG. 3A illustrates a graph representing a circuit design having a loop, according to one or more embodiments.

FIG. 3A illustrates a graph representing a circuit design having a loop, according to one or more embodiments. Each loop may be represented as a closed graph with specific notations for intermediate points. The shape of the graph may vary. In some embodiments, a polygon may be used for graphical representation of a loop. For example, FIG. 3A illustrates a closed graph having five nodes 310A-310E. The five nodes are connected to each other in RTL to form a loop. In the example of FIG. 3A, node A 310A is connected to node B 310B (through first path 315A), node B 310B is connected to node C 310C (through second path 315B), node C 310C is connected to node D 310D (through third path 315C), node D 310D is connected to node E 310E (through fourth path 315D), and node E 310E is connected to node A 310A (through fifth path 315E). Moreover, in the example of FIG. 3A, a pentagon is used to represent the loop having five nodes, in which each vertex of the polygon represents a circuit design node, and each side or line segment of the polygon may represent a connection in the circuit design.

In some embodiments, the nodes 310 shown in the loop 320 are signals from the RTL designs of the integrated circuit. In some embodiments, after the SCC graph processing system 100 identifies a loop by analyzing the netlist generated from the RTL designs, the SCC graph processing system 100 identifies the RTL design describing the identified loop and draws the loop based on the RTL design.

Figure 3B:
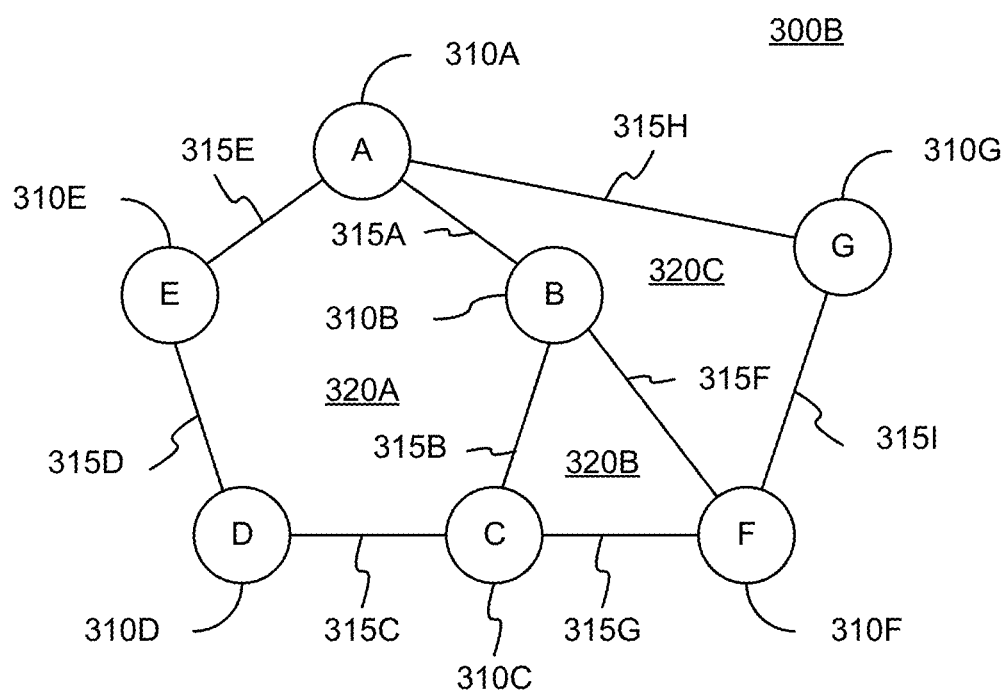
FIG. 3B illustrates a graph representing a circuit design having overlapping loops, according to one or more embodiments.

FIG. 3B illustrates a graph representing a circuit design having overlapping loops, according to one or more embodiments. Two loops are overlapping when one or more paths 315 are common across the two loops. For example, the graph shown in FIG. 3B includes a first loop 320A having nodes A, B, C, D, and E, and a second loop 320B having nodes B, F, and C. Since the first loop 320A and the second loop 320B have second path 315B (between nodes B and C) in common, first loop 320A and second loop 320B are overlapping. Moreover, the graph shown in FIG. 3B includes a third loop 320C having nodes A, G, F, and B. Since the first loop 320A and the third loop 320C have first path 315A (between nodes A and B) in common, the first loop 320A and the third loop 320C are overlapping. Similarly, since the second loop 320B and the third loop 320C have sixth path 315F (between nodes B and F) in common, the second loop 320B and the third loop 320C are overlapping. The entire circuit may become one SCC having three overlapping loops.

In some embodiments, loops may be represented using symmetrical polygons. For instance, the first loop 320A is represented using a symmetrical polygon (e.g., a pentagon). In other embodiments, some loops are represented using asymmetrical polygons. For instance, the third loop 320C is represented using an asymmetrical quadrilateral.

In some embodiments, to identify the SCC 300B, the SCC graph processing system 100 identifies the paths included in the first loop 320A. Specifically, the SCC graph processing system 100 identifies that the first loop 320A includes the first path 315A, the second path 315B, the third path 315C, the fourth path 315D, and the fifth path 315E. The SCC graph processing system 100 then identifies other loops that includes one or more of the paths 315 included in the first loop 320A. In the example of FIG. 3B, the SCC graph processing system 100 identifies other loops that include the first path 315A. As such, the SCC graph processing system 100 identifies the third loop 320C as overlapping with the first loop 320A. Moreover, in the example of FIG. 3B, the SCC graph processing system 100 identifies other loops that include the second path 315B. As such, the SCC graph processing system 100 identifies the second loop 320B as overlapping with the first loop 320A. This process is repeated for all other paths in the first loop 320A.

In some embodiments, once other loops overlapping the first loop 320A are identified, the SCC graph processing system 100 identifies additional loops that overlap with the identified loops that overlap with the first loop 320A. That is, in the example of FIG. 3B, the SCC graph processing system 100 identifies additional loops that overlap with the second loop 320B and the third loop 320C. In some embodiments, the SCC graph processing system 100 identifies paths in the loops overlapping with the first loop, and identifies additional loops that include the identified paths. For example, the SCC graph processing system 100 identifies that the second loop 320B further includes a sixth path 315F and the seventh path 315G, and identifies that the third loop 320C further includes an eight path 315H, and a ninth path 315I. The SCC graph processing system 100 then identifies loops that includes at least one of the sixth path 315F, seventh path 315G, eight path 315H, or the ninth path 315I.

In some embodiments, the representation of the loop may show connectivity direction. A loop may be traversed in a specific direction, such as a clockwise direction. Other graphical representations may also be possible, for example, using arrows. RTL language allows definition of bi-directional ports. If such ports become part of loops, they are drawn using directional algorithm.

Figure 4A:
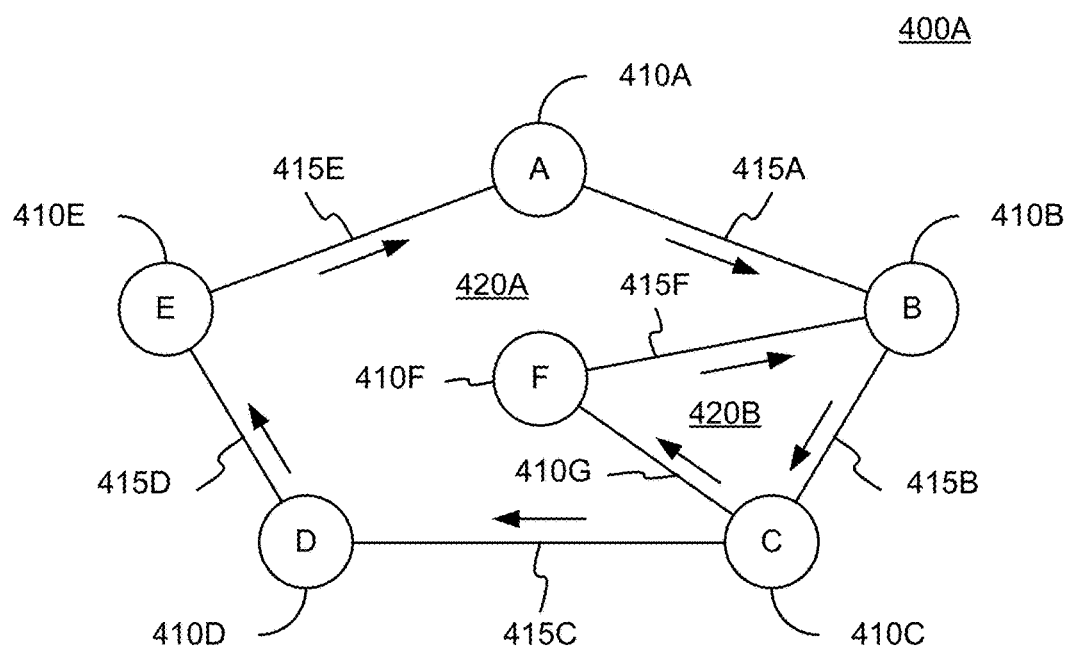
FIG. 4A illustrates an SCC having two loops sharing a unidirectional path, according to one or more embodiments.
Figure 4B:
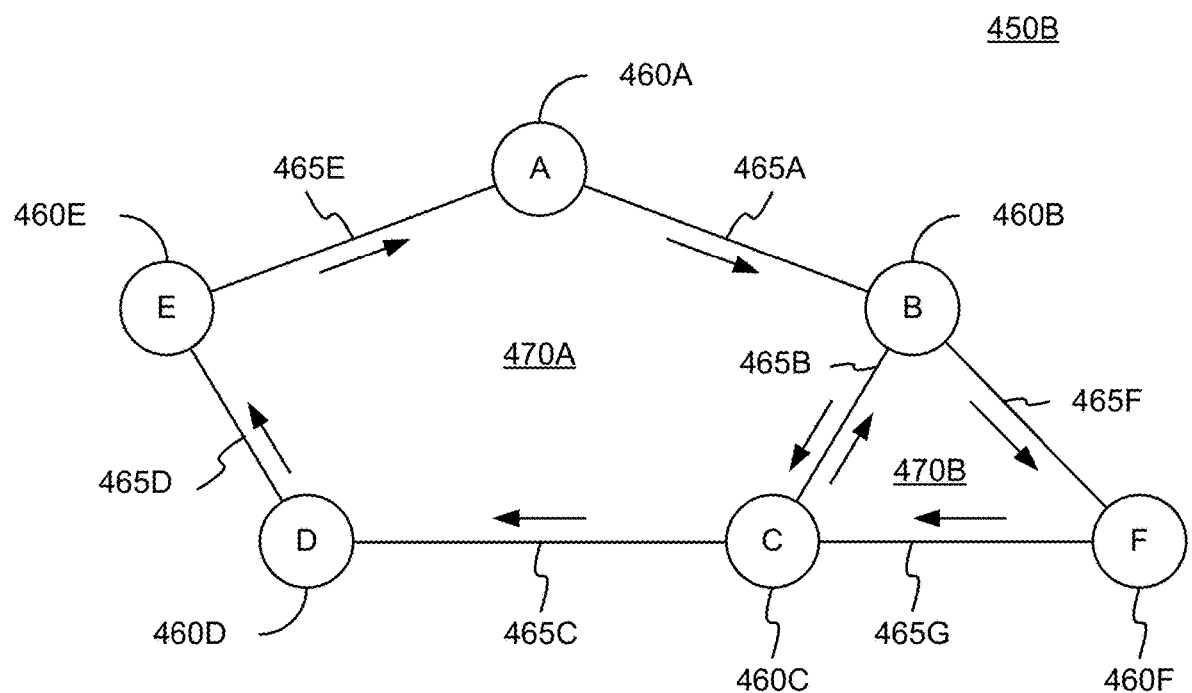
FIG. 4B illustrates an SCC having two loops sharing a bidirectional path, according to one or more embodiments.

FIG. 4A illustrates an SCC having two loops sharing a unidirectional path, according to one or more embodiments. FIG. 4B illustrates an SCC having two loops sharing a bidirectional path, according to one or more embodiments. In the example of FIG. 4A and FIG. 4B, the paths are traversed in the clockwise direction. As such, in the SCC 400A of FIG. 4A, the signal path of the first loop 420A is traversed from the first node (node A 410A) to the second node (node B 410B) to the third node (node C 410C) to the fourth node (node D 410D) to the fifth node (node E 410E) and back to the first node (node A 410A) (i.e., A→B→C→D→E→A); and the second loop 420B is traversed from the second node (node B 410B) to the third node (node C 410C) to the sixth node (node F 410F) and back to the second node (node B 410B) (i.e., B→C→F→B). Accordingly, the path between node B 410B and the node C 410C is traversed in the same direction for both loops.

In contrast, in the SCC 400B of FIG. 4B, the signal path of the first loop 470A is traversed from the first node (node A 460A) to the second node (node B 460B) to the third node (node C 460C) to the fourth node (node D 460D) to the fifth node (node E 460E) and back to the first node (node A 460A) (i.e., A→B→C→D→E→A); and the second loop 470B is traversed from the second node (node B 410B) to the sixth node (node F 410F) to the third node (node C 410C) and back to the second node (node B 410B) (i.e., B→F→C→B). Accordingly, the path between node B 410B and node C 410C is traversed in one direction in the first loop (from node B 460B to node C 460C), and is traversed in the opposite direction in the second loop (from node C 460C node B 460B).

As such, by looking at the graphical representation of each of the loops, a user is able to identify the directionality of each of the paths in the loop. Knowing whether a path unidirectional or bidirectional, and knowing the direction of a path within a loop can aid the user in determining whether a certain path is suitable to be considered as a candidate to be broken, or may aid the user in determining how a certain path can be broken.

Figure 5:
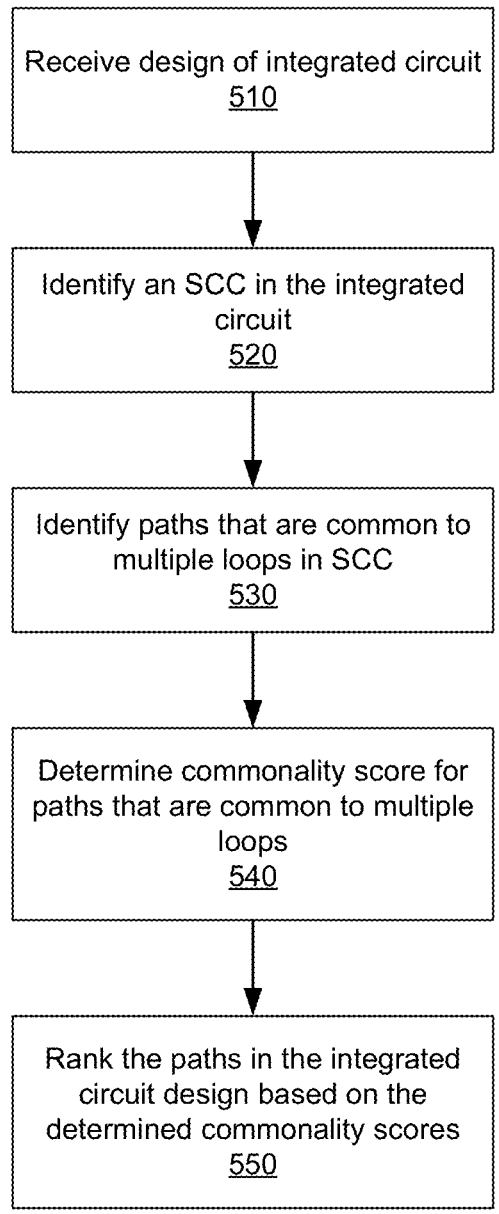
FIG. 5 illustrates a flow diagram of a process for identifying cut points in an SCC, according to one or more embodiments.

SCCs in a circuit are analyzed to identify connections that can be broken to remove loops in the circuit design. FIG. 5 illustrates a flow diagram of a process for identifying cut points in an SCC, according to one or more embodiments.

The SCC graph processing system 100 receives a design of an integrated circuit, at 510. In some embodiments, the design of the integrated circuit is received as a netlist. In other embodiments, the design of the integrated circuit is received as an RTL design. Based on the received design of the integrated circuit, one or more SCCs are identified, at 520. In some embodiments, the SCCs are identified using a process similar to the one described above in conjunction with FIG. 2.

The SCC graph processing system 100 identifies paths in the SCC that are common to multiple loops (shared paths). That is, the SCC graph processing system 100 identifies paths that are included in multiple loops of the SCC. The SCC graph processing system 100 then determines a commonality score for each shared path in the SCC. In some embodiments, the commonality score for a shared path is determined based on the number of loops that include a shared path. Moreover, in some embodiments, the commonality score is determined based on the length of each of the loops that include the shared path. Additionally, in some embodiments, the commonality score is determined based on whether the shared path is unidirectional or bidirectional. Furthermore, in some embodiments, the commonality score is determined based on the user input such as a pattern match for specific RTL name string. In some embodiments, the commonality score is determined as a weighted average of multiple parameters associated with the shared path (e.g., number of loops that include the shared path, length of each of the loops that include the shared path, directionality of the shared path, etc.). In other embodiments, the commonality score is determined by applying a model (e.g., a trained model) based on one or more parameters associated with the shared path.

Based on the commonality score, the shared paths in the SCC are ranked, at 550. In some embodiments, based on the commonality score, the circuit design system selects one or more shared paths and attempts to cut the shared paths to break one or more loops in the SCC. In some embodiments, a path is cut by introducing a register flopped by an emulation system clock, between the nodes connected by the shared path. Moreover, if the circuit design system is successful at cutting the path to break one or more loops, the circuit design system may display a message or an indication that the path was cut and information about the cut path.

Alternatively, the circuit design system may select a set of shared paths based on the commonality scores and present the selected shared paths to a user. The circuit design system may additionally present information about the selected shared paths to aid the user in selecting paths to cut to break one or more loops in the SCC. In some embodiments, the circuit design system may allow the user to select a shared path. The circuit design system may then attempt to cut the selected shared path to break one or more loops in the SCC. In some embodiments, the design tool may provide a message indicating whether the design tool was able to cut the path.

Figure 6A:
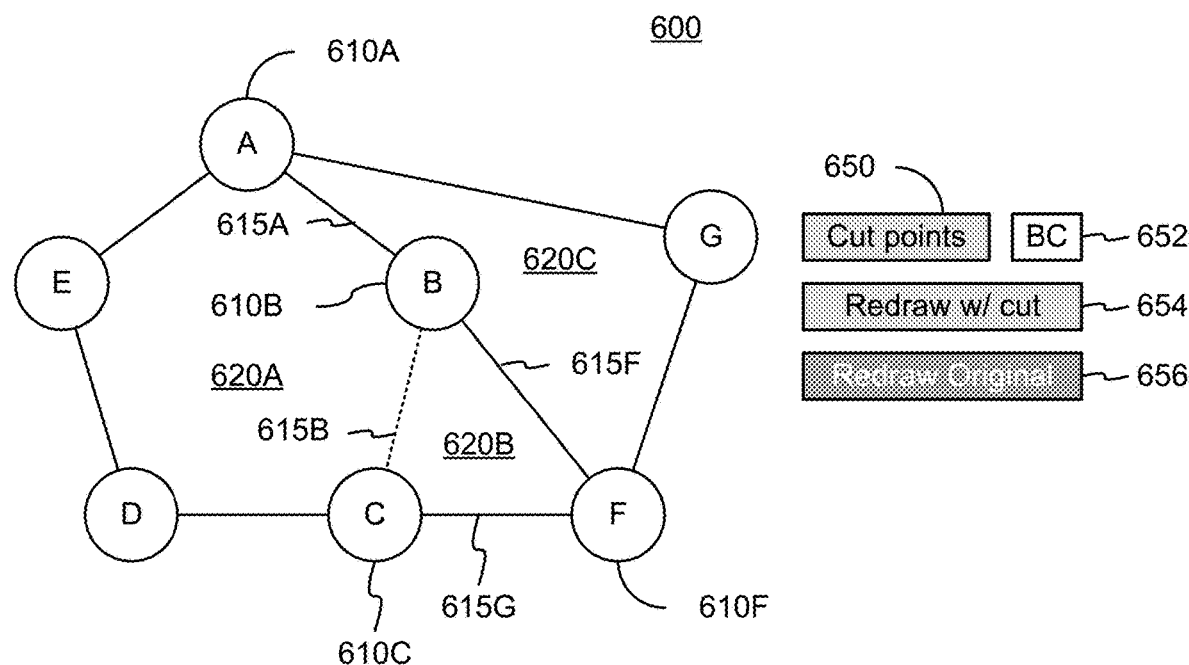
FIG. 6A illustrates a user interface (UI) showing overlapping loops with cut points, according to one or more embodiments.
Figure 6B:
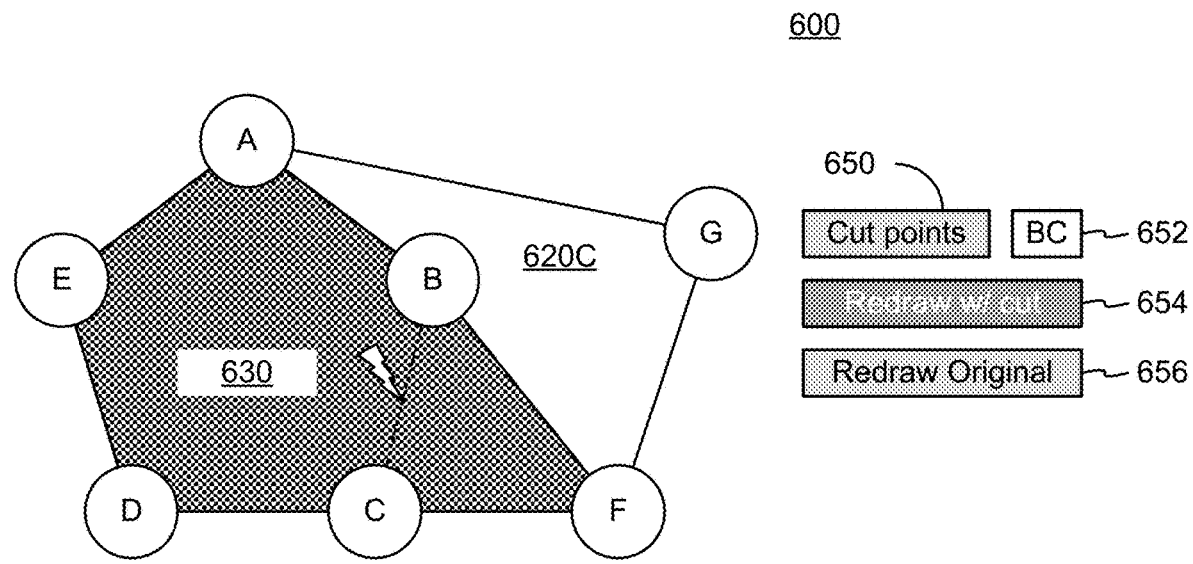
FIG. 6B illustrates a UI showing overlapping loops after a shared path has been cut, according to one or more embodiments.

FIG. 6A illustrates a user interface (UI) showing overlapping loops with cut points, according to one or more embodiments. FIG. 6B illustrates a UI showing overlapping loops after a shared path has been cut, according to one or more embodiments.

The SCC graph processing system 100 may identify SCC 600 and loops 620A, 620B, and 620C within SCC 600A. The SCC graph processing system 100 may analyze the data and use asymmetrical polygon shapes to show SCC 600 and associated smaller loops 620. The SCC graph processing system 100 may then predict potential break points by determining a commonality score for each path 615 in the SCC. For example, path 615A (between node A 610A and node B 610B) is common to the first loop 620A and the third loop 620C, and thus, has a commonality score of 2. In this example, the commonality score is based on the number of loops that include the shared path. However, the commonality score may be based on additional information such as the length of each of the loops that include the shared path. Similarly, path 615B (between node B 610B and node C 610C) is common to the first loop 620A and the second loop 620B, and thus, has a commonality score of 2. Similarly, path 615F (between node B 610B and node F 610F) is common to the second loop 620B and the third loop 620C, and thus, has a commonality score of 2.

In some embodiments, based on the commonality score, either a user or the design tool itself may determine path 615B as a cut point (e.g., represented by a dotted line). In some embodiments, the SCC/loop graph GUI 140 may be designed to include an interactive mode. For example, the SCC/loop graph GUI 140 may allow users to mimic the behavior of a loop break. Once the user chooses a path as a potential cut point, as shown in FIG. 6B, the SCC/loop graph GUI 140 may display redrawn loops that are left unbroken by shading or removing part of the graph completely. In the example of FIG. 6B, the user selects path 615B as a cut point and the SCC/loop graph GUI 140 displays the loop 630 that is formed or is left remaining after the first loop 620A and the second loop 620B are broken when the path 615B is cut.

In some embodiments, the loop database 110 may include entries of all loops within one SCC. User input (such as a sequence or list of cut points provided by a user) may be consumed by the processing & rendering engine 130 and matched with loop database 110 to understand which loops may be broken due to the user specified cut point(s). This cut point information may then be passed over to a processing & rendering engine 130 that changes the GUI display for SCC graph and inserts a notation to highlight which cut point(s) were added by the user.

This interactive processing & rendering engine may also be used to analyze the loops that are automatically broken by the compiler. A user may often need to review software results for functional correctness and to ensure that a design bug is not hidden due to the automatic breaking. In such cases, the graph is marked with all pre-applied cut points. Users have options to add/delete/move cut points and the interactive engine provides quick feedback to the user prior to performing re-compilation. In FIGS. 6A-6B, various buttons are provided to facilitate interactive user play. A user can add, modify or delete any number of cut points using a "cut points" button 650. Moreover, the user interface may include buttons for each of the identified cut points. For example, the user interface of FIGS. 6A and 6B include a "BC" button 652 to select or unselect path 615B. A "redraw with cut" button 654 triggers an action to the processing & rendering engine to consume "cut points" information provided by the user and redraw a simplified version of the graph. At any given time, a user can access the original graph by selecting a "Redraw Original" button 656.

The graph may be fully connected with an RTL compiler and viewer tool 150. Using any vertex on a polygon, a user can navigate to the RTL source code. This link between the RTL source code and the SCC graph may provide a user with a mechanism to look at the surrounding logic and determine if the cut point chosen of loop break is correct from the design functionality point of view. For example, the user may break a loop by adding a flop clocked by a fast emulation system clock. The link between the RTL source code and the SCC graph enables the user to review the logic surrounding the path where the flop is to be added by allowing the user to open a schematic viewer and/or RTL viewer from the graphical representation of the SCC to determine that loop break point would indeed be functionally correct.

In some embodiments, by way of a non-limiting example, loops may be created by the compiler itself and an original RTL design may not have a loop. In such cases, the corresponding vertex of the polygon may not have a corresponding RTL name and the link with RTL viewer tool may not work. Such vertices may be automatically identified and marked differently in the graph. The marked vertices may clearly differentiate loops that may be present in the original design source code from the loops that are created by the emulation compiler.

In some embodiments, a circuit design may include one or more large SCCs with a very high number of overlapping loops. In some cases, as the size of an SCC increases, the number of loops within the SCC may increase exponentially. Storing and analyzing such exponentially high number of loops may not be practical. The processing & rendering engine 130 may limit the number of inner loops within a SCC that are analyzed or considered. The present system may provide multiple selections (e.g., for user selection) for limiting the number of inner loops within a SCC for further analysis. For example, the present system provides a selection for number (<N>) of loops before stopping SCC analysis. In another example, the present system provides a selection to allow a user to process any SCC for a certain amount of time and present loops identified within such a time budget. To further simplify the analysis, the present system provides a selection for a user to select a smaller subset from identified loops. A user may choose a number (<M>) of smallest loops or may choose a number (<O>) of loops that cover the nets with highest commonality score. Once the analysis is done on this smaller sub-set, SCC would be reduced and can be reanalyzed for full resolution.

Figure 7:
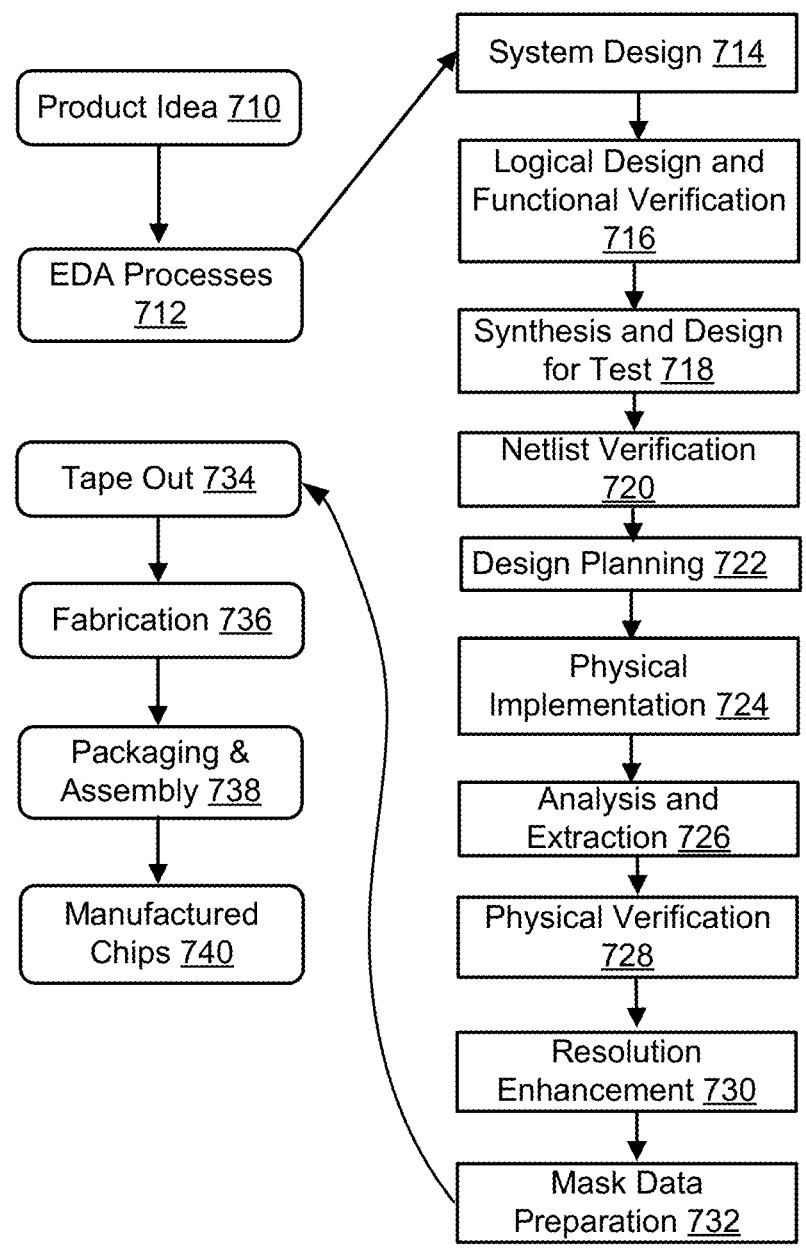
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 9, or host system 807 of FIG. 8) may be used to store the programs and data structures that are used by some or all of the EDA products described herein, and products used for development of cells for the library and for physical and logical design that use the library.

Figure 8:
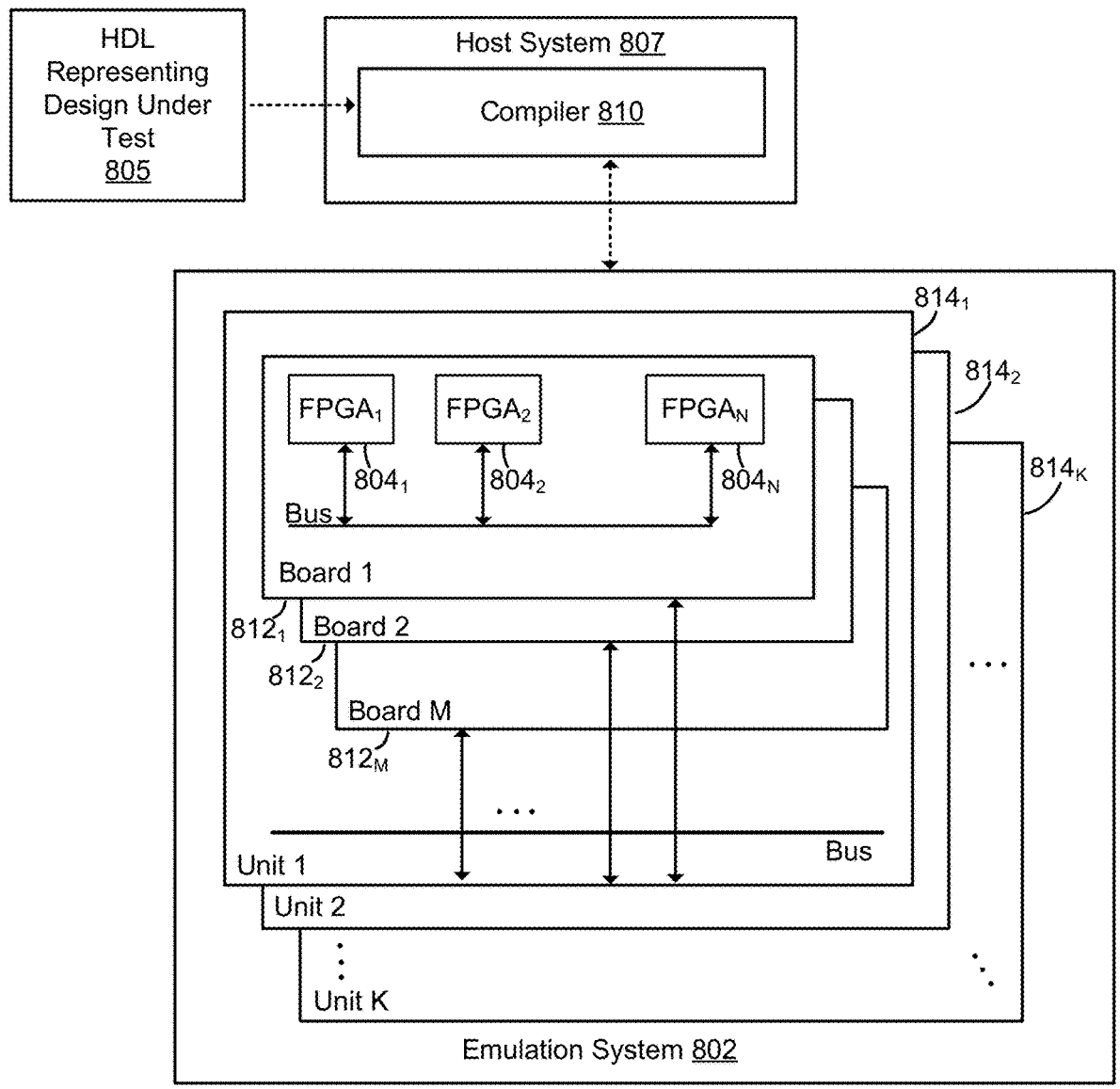
FIG. 8 depicts a diagram of an example emulation system in accordance with some embodiments of the present disclosure.

FIG. 8 depicts a diagram of an example emulation environment 800. An emulation environment 800 may be configured to verify the functionality of the circuit design. The emulation environment 800 may include a host system 807 (e.g., a computer that is part of an EDA system) and an emulation system 802 (e.g., a set of programmable devices such as Field Programmable Gate Arrays (FPGAs) or processors). The host system generates data and information by using a compiler 810 to structure the emulation system to emulate a circuit design. A circuit design to be emulated is also referred to as a Design Under Test ('DUT') where data and information from the emulation are used to verify the functionality of the DUT.

The host system 807 may include one or more processors. In the embodiment where the host system includes multiple processors, the functions described herein as being performed by the host system can be distributed among the multiple processors. The host system 807 may include a compiler 810 to transform specifications written in a description language that represents a DUT and to produce data (e.g., binary data) and information that is used to structure the emulation system 802 to emulate the DUT. The compiler 810 can transform, change, restructure, add new functions to, and/or control the timing of the DUT.

The host system 807 and emulation system 802 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 807 and emulation system 802 can exchange data and information through a third device such as a network server.

The emulation system 802 includes multiple FPGAs (or other modules) such as FPGAs $804_1$ and $804_2$ as well as additional FPGAs to $804_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 802 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $804_1$-$804_N$ may be placed onto one or more boards $812_1$ and $812_2$ as well as additional boards through $812_M$. Multiple boards can be placed into an emulation unit $814_1$. The boards within an emulation unit can be connected using the backplane of the emulation unit or any other types of connections. In addition, multiple emulation units (e.g., $814_1$ and $814_2$ through $814_K$) can be connected to each other by cables or any other means to form a multi-emulation unit system.

For a DUT that is to be emulated, the host system 807 transmits one or more bit files to the emulation system 802. The bit files may specify a description of the DUT and may further specify partitions of the DUT created by the host system 807 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 807 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 807 and/or the compiler 810 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 805 into gate level logic. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 9:
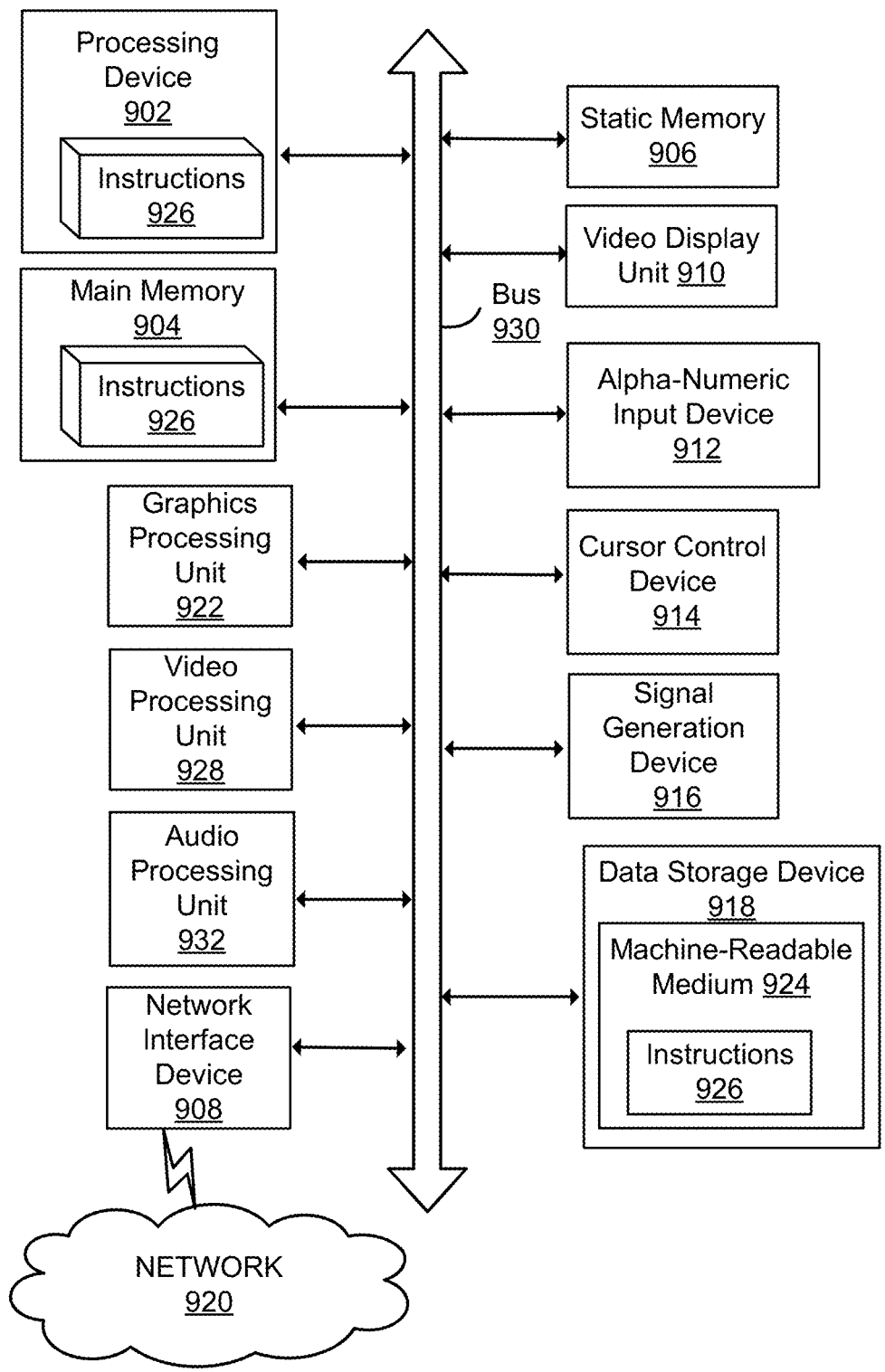
FIG. 9 depicts a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A non-transitory computer readable medium comprising stored program code, the program code comprising instructions which when executed by a processor, cause the processor to:
    receive a design of an integrated circuit;
    identify a plurality of loops in the design of the integrated circuit;
    determine one or more strongly connected components (SCC) based on the identified plurality of loops, each strongly connected component including at least a first loop having a first set of nodes connected via a first set of paths, and a second loop having a second set of nodes connected via a second set of paths, and wherein the first loop and the second loop have at least one path in common;
    determine a commonality score for each of one or more shared paths in the SCC, each shared path included in multiple loops of the SCC;
    rank the one or more shared paths based on the determined commonality score for each shared path in the SCC; and
    provide for display, using a graphical user interface, the one or more strongly connected components to a user.

2. The non-transitory computer readable medium of claim 1, wherein the instructions for identifying a plurality of loops in the design of the integrated circuit cause the processor to perform a connectivity analysis on a netlist of the design of the integrated circuit.

3. The non-transitory computer readable medium of claim 2, wherein the instructions for performing a connectivity analysis cause the processor to:
    identify one or more signal paths that start at a given node in the design of the integrated circuit, and return to the given node.

4. The non-transitory computer readable medium of claim 1, wherein the instructions for receiving a design of the integrated circuit cause the processor to:
    receive a register transfer level (RTL) design of the integrated circuit;
    compile the RTL design to generate a netlist of the integrated circuit; and
    identify loops in the design of the integrated circuit based on the generated netlist by identifying one or more signal paths that starts at a given net of the netlist and returns to the given net.

5. The non-transitory computer readable medium of claim 1, wherein the commonality score is based at least on one or more of a number of loops that include the shared path, a length of each loop that includes the shared path, a direction of the shared path, and a name string associated with the shared path.

6. The non-transitory computer readable medium of claim 1, wherein the instructions further cause the processor to:
    identify one or more paths to cut based on the commonality score of each shared path in the SCC.

7. The non-transitory computer readable medium of claim 1, wherein the instructions for presenting the one or more strongly connected components to the user cause the processor to:
    represent each strongly connected component using a directional, asymmetrical polygon, wherein each vertex of the polygon corresponds to a node of the strongly connected components, and each line segment of the polygon represents a path connecting two nodes of the strongly connected components.

8. The non-transitory computer readable medium of claim 1, wherein the instructions further cause the processor to:
    analyze a subset of loops of a strongly connected component to identify one or more paths to cut within each loop of the subset of loops until a stop condition is met; and
    present an analysis report to the user based on the analysis of the subset of loops in the strongly connected component.

9. The non-transitory computer readable medium of claim 8, wherein the stop condition is one or more of a set number of loops being analyzed, and a set amount of time lapsed.

10. A system comprising:
    a non-transitory memory comprising stored program code; and
    a processor, coupled with the memory and to execute the program code, the program code comprising instructions that when executed cause the processor to:
        receive a design of an integrated circuit;
        identify a plurality of loops in the design of the integrated circuit;
        determine one or more strongly connected components (SCC) based on the identified plurality of loops, each strongly connected component including at least a first loop having a first set of nodes connected via a first set of paths, and a second loop having a second set of nodes connected via a second set of paths, and wherein the first loop and the second loop have at least one path in common; and
        present, using a graphical user interface, the one or more strongly connected components to a user, the instructions to present further comprises instructions to:
            represent each strongly connected component using a directional, asymmetrical polygon, wherein each vertex of the polygon corresponds to a node of the strongly connected components, and each line segment of the polygon represents a path connecting two nodes of the strongly connected components.

11. The system of claim 10, wherein the instructions to identify a plurality of loops in the design of the integrated circuit further comprises instructions that when executed cause the processor to perform a connectivity analysis on a netlist of the design of the integrated circuit.

12. The system of claim 11, wherein the instructions to perform a connectivity analysis further comprises instructions that when executed cause the processor to:
    identify one or more signal paths that start at a given node in the design of the integrated circuit, and return to the given node.

13. The system of claim 10, further comprising instructions that when executed cause, for a strongly connected component (SCC) of the identified one or more strongly connected components, the processor to:
    identify a plurality of shared paths in the SCC, each shared path included in multiple loops of the SCC;
    determine a commonality score for each shared path in the SCC; and
    rank the plurality of shared paths based on the determined commonality score for each shared path in the SCC.

14. The system of claim 13, wherein the commonality score is based at least on one or more of a number of loops that include the shared path, and a length of each loop that includes the shared path, a direction of the shared path, and a name string associated with the shared path.

15. The system of claim 13, further comprising instructions that when executed cause the processor to:
identify one or more paths to cut based on the commonality score of each shared path in the SCC.

16. The system of claim 10, further comprising instructions that when executed cause the processor to:
analyze a subset of loops of a strongly connected component until a stop condition is met; and
present an analysis report to the user based on the analysis of the subset of loops in the strongly connected component.

17. The system of claim 16, wherein the stop condition is one of a set number of loops being analyzed, and a set amount of time lapsed.

18. A method comprising:
receiving a design of an integrated circuit;
identifying a plurality of loops in the design of the integrated circuit;
determining one or more strongly connected components (SCC) based on the identified plurality of loops, each strongly connected component including at least a first loop having a first set of nodes connected via a first set of paths, and a second loop having a second set of nodes connected via a second set of paths, and wherein the first loop and the second loop have at least one path in common;
determining a commonality score for each of one or more shared paths in the SCC, each shared path included in multiple loops of the SCC;
ranking the one or more shared paths based on the determined commonality score for each shared path in the SCC; and
providing for display, using a graphical user interface, the one or more strongly connected components to a user.

19. The method of claim 18, wherein identifying a plurality of loops in the design of the integrated circuit comprises: performing a connectivity analysis on a netlist of the design of the integrated circuit.

20. The method of claim 18, further comprising:
analyzing a subset of loops of a strongly connected component until a stop condition is met; and
presenting an analysis report to the user based on the analysis of the subset of loops in the strongly connected component.

* * * * *